(12) United States Patent
Huang et al.

(10) Patent No.: US 6,248,631 B1
(45) Date of Patent: Jun. 19, 2001

(54) METHOD FOR FORMING A V-SHAPED FLOATING GATE

(75) Inventors: Chin-Yi Huang, Pao Shan; Yun Chang; Samuel C. Pan, both of Hsinchu, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/415,788

(22) Filed: Oct. 8, 1999

(51) Int. Cl.$^7$ ..................... H01L 21/8242; H01L 21/336
(52) U.S. Cl. ................. 438/260; 438/254; 438/257
(58) Field of Search .......................... 438/260, 254, 438/257, 253, 259

(56) References Cited

U.S. PATENT DOCUMENTS

| | | | |
|---|---|---|---|
| 5,677,216 | * | 10/1997 | Tseng ..................................... 437/43 |
| 5,923,974 | * | 7/1999 | Liang et al. ........................... 438/257 |
| 6,069,040 | * | 5/2000 | Miles et al. ........................... 438/260 |

OTHER PUBLICATIONS

Kitamura et al. "A Low Voltage Operating Flash Memory Cell with High Coupling Ratio Using Horned Floating Gate with Fine HSG", 1998 Symposium on VLSI Technology

* cited by examiner

Primary Examiner—Richard Elms
Assistant Examiner—Adam Pyonin
(74) Attorney, Agent, or Firm—Mark A. Haynes; Haynes & Beffel LLP

(57) ABSTRACT

The invention provides a floating gate memory cell, where the floating gate comprises a first lateral end region and a second lateral end region. A middle region is positioned towards a middle of the floating gate with respect to the first lateral end region and the second lateral end region. The thickness of the floating gate decreases continuously from at least one of the first or second lateral end regions to the middle region. This invention also provides for a method of forming a contoured floating gate for use in a floating gate memory cell. The method includes forming a polysilicon structure between a first alignment structure and a second alignment structure, where the polysilicon structure has a maximum thickness at a first lateral end region adjacent to the first alignment structure and at a second lateral end region adjacent to the second alignment structure, and where the polysilicon structure has a minimum thickness at a middle region positioned between the first lateral end regions and the second lateral end region. The method further includes forming a polysilicon layer over the polysilicon structure such that the polysilicon layer adopts a contour of the polysilicon structure.

23 Claims, 7 Drawing Sheets

METHOD FOR FORMING A V-SHAPED FLOATING GATE

BACKGROUND OF THE INVENTION

1. Field of the Invention

The present invention relates to non-volatile digital memory, and more particularly, to FLASH EPROM memory incorporating novel floating gates having reduced lateral dimensions.

2. Description of Related Art

FLASH EPROM memory is a class of non-volatile storage integrated circuits. In general, FLASH EPROMS have the capability of electrically erasing, programming, or reading a memory cell on a chip. Generally, a FLASH EPROM includes a floating gate and a control gate which form an electrical connection. A FLASH EPROM operates by charging or discharging electrons in the floating gate of the memory cell in a capacitive manner. The floating gate is formed of a conductive material, typically made of polysilicon, which is insulated from the channel of the transistor by a layer of oxide or other insulating material, and insulated from the control gate or word-line of the transistor by a second layer of insulating material.

The act of charging the floating gate is termed a Aprogram@ step for a FLASH EPROM. The program step may be accomplished through so-called hot electron injection by establishing a large positive voltage between the control gate and the source. The act of discharging the floating gate is called the Aerase@ function for a FLASH EPROM. The erase function is typically carried out by an F-N tunneling mechanism between the floating gate and the source of the transistor (source erase) or between the floating gate and the substrate (channel erase).

Due to increasing memory demands, a need exists to further reduce the size of memory devices, such as FLASH EPROMs. Reducing the cell size of memory devices increases performance and reduces power consumption.

Several devices have been developed with reduced cell size. One such device is described in AA Low Voltage Operating Flash Memory Cell with High Coupling Ratio Using Horned Floating Gate with Fine HSG,@ by Kitamura et al., 1998 *Symposium on VLSI Technology Digest of Technical Papers*. Another example of a memory device with reduced cell size is described in AA 0.24-Fm Cell Process With 0.18-Fm Width Isolation and 3D Interpoly Dielectric Films for 1-GB Flash Memories@ by Kobayashi et al., *IEEE* 97–275 (1997).

Reducing the size of a memory cell has led to memory cells with certain disadvantages including overbearing floating gates, or intermediate structures formed during the manufacturing of the floating gate, which degrade the tunnel oxide layer. The formation of sharp corners on the floating gate also leads to charge leakage.

SUMMARY OF THE INVENTION

An embodiment of this invention provides a floating gate memory cell, where the floating gate comprises a first lateral end region and a second lateral end region. A middle region is positioned towards a middle of the floating gate with respect to the first lateral end region and the second lateral end region. The thickness of the floating gate decreases continuously from at least one of the first or second lateral end regions to the middle region.

Another embodiment of the invention provides for a floating gate in a floating gate memory cell. The floating gate includes a first polysilicon material deposited in a first fabrication step to extend from a first lateral end to a second lateral end. A second polysilicon material is deposited over the first polysilicon material to form a first tapered sidewall adjacent to the first lateral end, and a second tapered sidewall adjacent to the second lateral end. A third polysilicon material is deposited in a third fabrication step over at least the first or second polysilicon material to extend from the first lateral end to the second lateral end.

In regard to any of the embodiments, a variation may provide for the thickness of the floating gate to be substantially symmetrical about the middle region of the floating gate. A symmetrical distribution of thickness enables a three dimensional contour to be developed for the floating gate that has a minimum thickness centrally positioned with respect to lateral ends having a maximum thickness.

Another variation to the above embodiments may provide for a floating gate to be formed from a first polysilicon material deposited in a first fabrication step, a second polysilicon material deposited at the lateral end regions in a second fabrication step, and a third polysilicon material deposited in a third fabrication step. As will be further described, the third polysilicon material may be deposited to adapt a contour formed from polysilicon material deposited in a first and second step.

Another variation to the above embodiments may provide for the first and second lateral end regions to be formed from the first, second and third polysilicon materials, and the middle region to be formed from the first and third polysilicon materials.

Another variation to the above embodiments may provide the first and second lateral end regions to each have a uniform thickness across a top surface distal to an underlying substrate. The first and second lateral end regions may also be formed as peaks.

The floating gates of the above embodiments may each also be provided in a floating gate memory cell, where the floating gate memory cell includes a substrate, source and drain regions positioned over the substrate, an insulating layer positioned over the source and drain regions, and a floating gate positioned over the insulating layer between the source and drain regions.

The invention also relates to methods of forming a contoured floating gate for use in a floating gate memory cell. One embodiment of the method includes forming a polysilicon structure between a first alignment structure and a second alignment structure, where the polysilicon structure has a maximum thickness at a first lateral end region adjacent to the first alignment structure and at a second lateral end region adjacent to the second alignment structure, and where the polysilicon structure has a minimum thickness at a middle region positioned between the first lateral end regions and the second lateral end region. The method further includes forming a polysilicon layer over the polysilicon structure such that the polysilicon layer adopts a contour of the polysilicon structure.

The method may further include forming a polysilicon structure between a first alignment structure and a second alignment structure by depositing a first polysilicon layer over the substrate, and by depositing a second polysilicon layer over the first polysilicon layer so that the second polysilicon layer has a maximum thickness at the first lateral end region and at the second lateral end region.

In another embodiment, a method is provided which includes forming a first polysilicon structure by depositing a first polysilicon layer over a substrate underlying the contoured floating gate between the first and second alignment structure, and forming a second polysilicon layer over a topography defined by the first alignment structure, the second alignment structure, and the first polysilicon layer. The method further includes removing the second polysilicon layer from the first and second alignment structure after depositing the second polysilicon layer over the topography, and forming a third polysilicon layer over the second polysilicon such that the third polysilicon layer adopts a contour of the second layer.

The method may further include forming a polysilicon structure by removing a portion of the second polysilicon layer from the middle region.

Another embodiment of the invention includes forming a polysilicon structure by removing a portion of the first polysilicon layer in a process to remove the portion of the second polysilicon layer from the middle region.

Another embodiment of the invention includes forming a polysilicon structure by removing a portion of the second polysilicon layer from the middle region so that a remaining portion of the second polysilicon layer has a sloped thickness with a maximum thickness at the first lateral end region and at the second lateral end region.

Variations to the above embodiments may further include forming a first polysilicon structure by removing a portion of the second polysilicon layer from the middle region of the polysilicon structure so as to form a contoured recess that defines the region positioned towards the middle of the floating gate having the minimum thickness.

Embodiments of the present invention may also provide for forming a floating gate memory cell by providing a substrate, forming source and drain regions over the substrate, and depositing an insulating layer over the source and drain regions. The method includes forming a contoured floating gate positioned over the insulating layer between the source and drain regions, the floating gate being formed by the methods described above.

DESCRIPTION OF THE PREFERRED EMBODIMENT

The present invention relates to a flash memory cell design providing a reduced lateral dimension by incorporating into a floating gate a contoured three-dimensional coupling surface. The contoured coupling surface is created by fabricating material for forming the floating gate such that it varies in thickness across its lateral dimension. The floating gate is shaped by the fabrication process.

Embodiments of the present invention provide a floating gate formed from a bottom polysilicon structure having a contour defined by at least two polysilicon layers. The contour includes a maximum thickness at lateral ends of the floating gate, and a minimum thickness at a deflection towards a middle of the floating gate. Another polysilicon layer is deposited over the bottom polysilicon structure which adopts the contours of the bottom polysilicon structure. Each of the polysilicon layers used to form the floating gate may be deposited in separate fabrication steps. The bottom polysilicon structure may be formed by sequentially depositing a first and second polysilicon layer, and then removing a portion of the second polysilicon layer to form sidewalls at the lateral ends of the floating gate.

A portion of the first polysilicon layer which abuts the substrate underneath the floating gate may also be removed to form a deflection or minimum thickness region.

In an embodiment of the invention, the thickness of the floating gate increases continuously from a minimum thickness region towards a middle of the floating gate to the lateral ends of the floating gate. The floating gate may have a region at each lateral end which has a same thickness. Alternatively, the thickness of the floating gate may continuously increase to a peak at the lateral ends. As used herein, continuously increasing means that the thickness of the coupling surface always increases as the lateral position on the coupling surface becomes closer to the lateral ends or the lateral end regions. However, it is noted that the rate of increase may not always be linear. The resulting structure of embodiments of the present invention form a three-dimensional coupling surface that increases the coupling ratio with a control gate.

As will be described in greater detail below, use of the floating gate of the present invention provides significant advantages in that a smaller memory cell is provided with comparable performance to other FLASH EPROM memory cells known in the art which have larger dimensions. Among other advantages, the memory cell of the present invention is inexpensive to manufacture, and avoids leakage of electrical charge from the floating gate.

Figure 1:
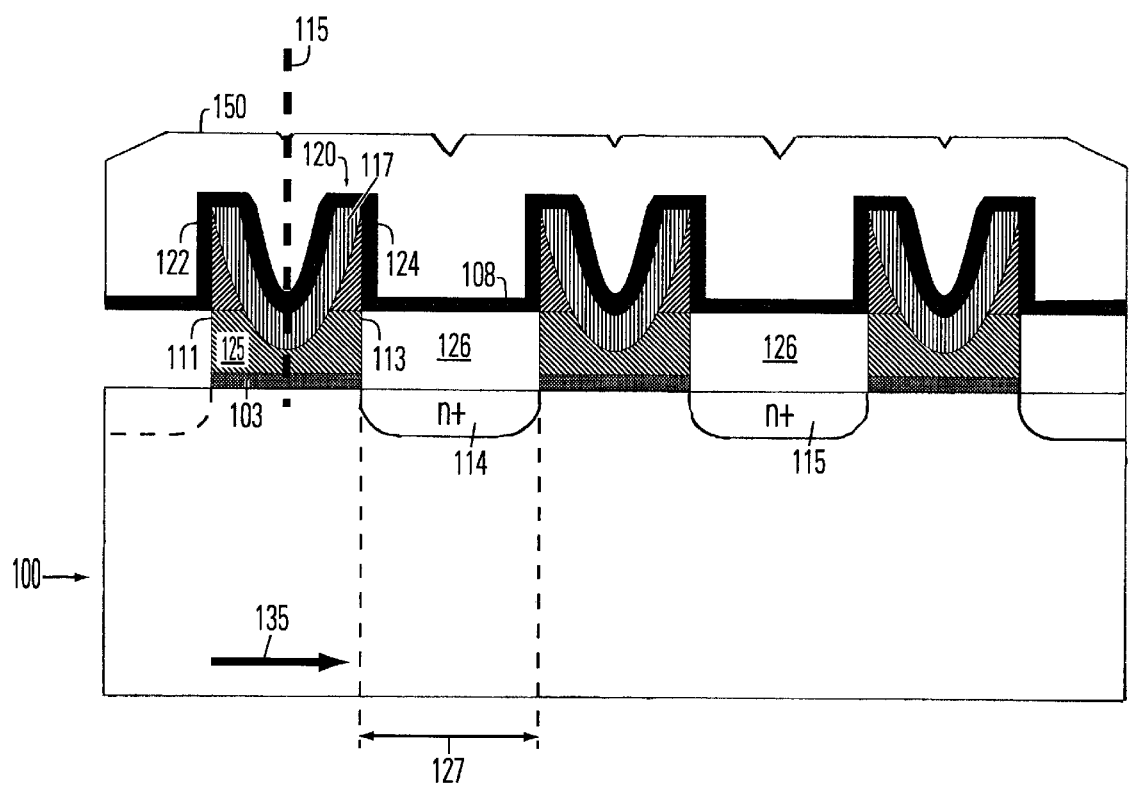
FIG. 1 illustrates a memory cell according to the present invention.

FIG. 1 illustrates memory cells according to the invention aligned in a column to form a memory array or FLASH EPROM device. The memory cells in the column share a semiconductor substrate 100. The particular design or formation of the semiconductor substrate 100 may be varied depending on the memory device architecture. For example, for the source-drain-source configuration shown in FIG. 4, the semiconductor substrate 100 may be p-type, as illustrated in FIG. 1. A n+-type source 114 and n+-type drain region 115 may be distributed over the substrate 100. Preferably, a plurality of alignment structures, shown here as oxide structures 126, are individually encapsulated over an oxide region 127 of the substrate 100. A plurality of floating gates 120 are formed between the oxide structures 126 with each floating gate 120 positioned over a corresponding channel region of the substrate 100. Preferably, the floating gates 120 abut the oxide structures 126 at a first and second lateral end 111 and 113. An insulative layer such as a tunnel oxide layer 103 may separate the substrate 100, the floating gate 120, and possibly the oxide structure 126. Preferably, the source and drain regions 114 and 115 are each positioned substantially underneath one of the oxide structures 126.

Figure 2A:
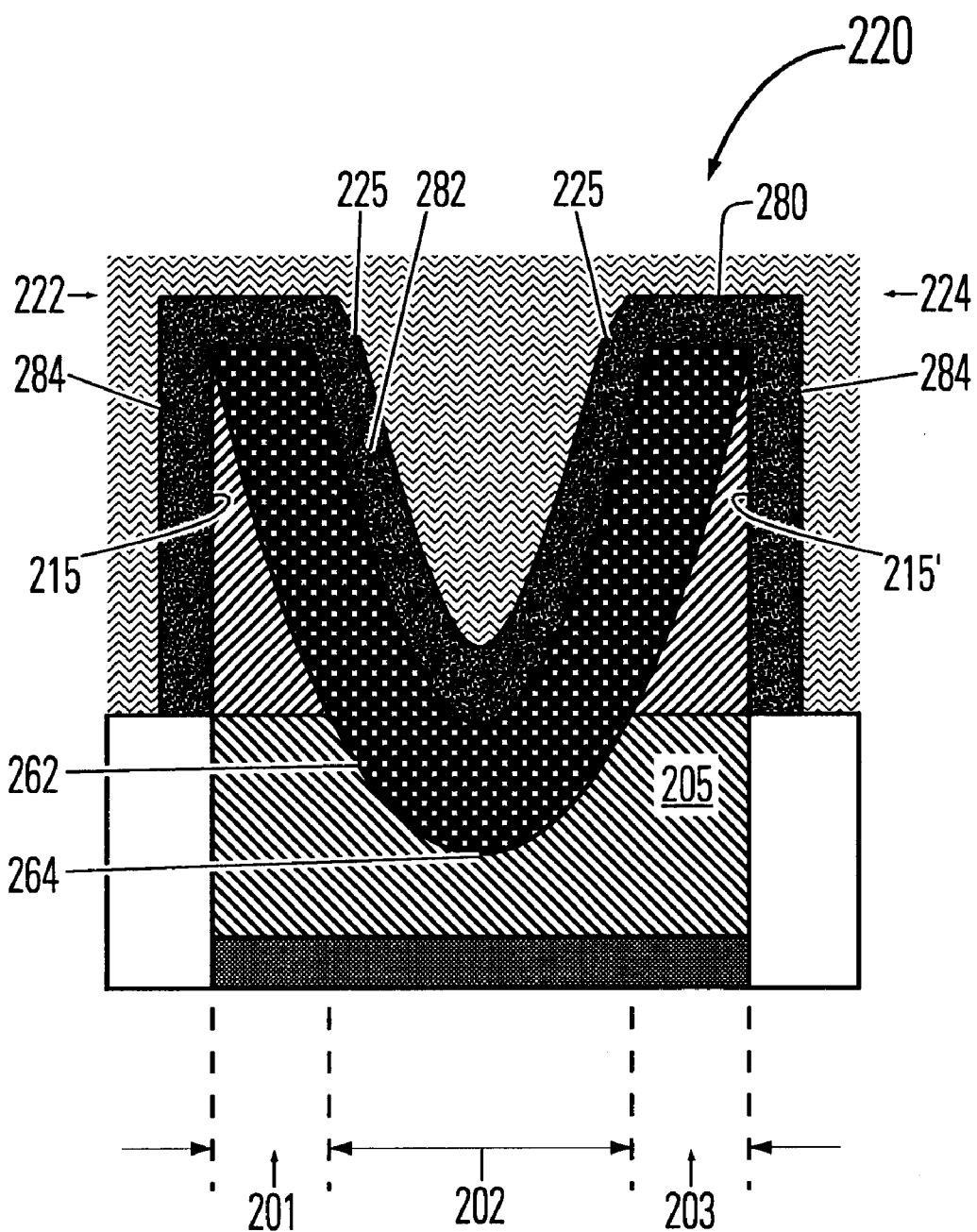
FIG. 2A illustrates an embodiment of a floating gate according to the present invention.

The floating gates 120 extend laterally in a word line direction, as shown by the directional arrow 135. Additional floating gates 120 aligned in a bit line direction extending into the paper are not shown. Each floating gate 120 is formed from a polysilicon body having a vertical thickness in one or more regions that is greater than a vertical thickness of the oxide structure 126. As will be described in greater detail below, the floating gate 120 is formed from a base structure 125 that extends between a first lateral end 122 and a second lateral end 124. An upper portion 117 having a concave coupling surface is formed over the base structure 125, so that the overall thickness of the floating gate 120 is greatest adjacent to the lateral ends 122, 124, and least at the middle region. Preferably, the thickness of the floating gate decreases continuously from regions adjacent to the first and second lateral ends 122, 124 to a minimum thickness at a central base line represented by the broken line 118 positioned within the middle region. While the thickness of the floating gate 120 is preferably symmetrical about the central baseline line 118, variations to this embodiment may provide for the minimum thickness of the floating gate 120 to be provided at a centrally offset base line. In one embodiment such as shown in FIG. 2A, three or more layers of polysilicon are used to form a contoured upper portion and a base structure.

As illustrated, the memory cell 100 may further include an interpolysilicon dielectric 108 deposited over the oxide structures 126 and the floating gate 120. A third layer of polysilicon 150 is deposited over the interpolysilicon dielectric 108 to form the word-line control gate. As a result of the shapes of the respective floating gates 120 and oxide structures 126, the deposition of the polysilicon layer over the interpolysilicon dielectric forms trenches in alignment over the oxide layers and floating gates.

One advantage of this invention includes providing the floating gate 120 with an increased coupling surface. The increase in coupling surface correlates directly with the coupling ratio between the floating gate and control gate, and allows for the floating gate to occupy less area on the substrate 100, thereby reducing the overall size of the memory cell. Moreover, the operational voltage of the FLASH EPROM can be reduced and the circuitry can be simplified. Another advantage of reducing the size of the floating gate is that the present invention avoids floating gate structures comprising polywings or laterally spanning floating gates that extend and vertically overlap with the source/drain diffusion regions. As such, the cell structure of the present invention can reduce drain coupling ratio and drain leakage when the cell is being programmed. Likewise, the cell structure of the present invention can reduce source coupling ratio during F-N erase operations.

The design of floating gates used in the present invention will now be described in greater detail. FIG. 2A illustrates a first embodiment of a floating gate 220 according to the present invention. In this embodiment, a first polysilicon layer is deposited in a first fabrication step to form a base 205 extending from the first lateral end 222 to the second lateral end 224. A second polysilicon layer is deposited in separate regions over the first polysilicon layer adjacent to the first lateral end 222 and the second lateral end 224 to form a tapered sidewall adjacent to the respective lateral end. A third polysilicon layer is deposited over the structure formed by the first and second polysilicon layers to form a contoured coupling surface 225 extending between the first and second lateral ends 222 and 224.

As illustrated by FIG. 2A, the floating gate 220 may be divided into three regions moving left to right: a first lateral end region 201, a second lateral end region 203, and a middle region 202 positioned laterally towards a middle of the floating gate with respect to the lateral end regions 201 and 203. In the embodiment of FIG. 2A, a thickness of the middle region 202 includes the first layer of polysilicon and the third layer of polysilicon. A thickness of the lateral end regions 211 and 213 includes the first, second, and third layers of polysilicon.

In an embodiment, the thickness of the base structure 205 varies to provide a portion a contoured recess 262 having a minimum thickness region 264. The varying thickness of the base 205 forms a deflection of the floating gate's concavity located at a middle of the floating gate 220. The tapered sidewalls 215, 215' formed by the second polysilicon layer are defined by a lateral length that is greatest over the first polysilicon layer and least at a top point or surface of the floating gate over the first and second lateral ends 222, 224. The third polysilicon layer is deposited over the first and second polysilicon layers to extend between the lateral ends 222, 224 and into the contoured recess 262 of the base structure 205. The third polysilicon layer adopts the contour of the polysilicon structure formed by the first and second layers of polysilicon. In this manner, the first, second, and third polysilicon layers combine so that the thickness of the floating gate 220 increases continuously from the middle region to the first and second lateral end regions 201 and 203. The resulting coupling surface 225 is defined by a thickness profile of the floating gate 220 where a slope of the thickness profile between the deflection region and each of the lateral end regions is between 0 and 90 degrees.

In FIG. 2A, the lateral end regions 201 and 203 may be formed by the third polysilicon layer to have relatively uniform thickness so as to form plateaus 280 that are parallel to an underlying substrate. The third polysilicon layer also forms an interior surface 282 having a contour defined by the sidewalls of the second polysilicon layer and the recess of the first polysilicon layer. The floating gate includes a border surface 284 to each oxide structure that is perpendicular to the substrate 100. Preferably, the juncture of the plateau 280 and the interior surface 282 forms an angle less than 90 degrees. In an embodiment, each plateau 280 and border surface 284 may form a 90 degree angle.

Figure 2B:
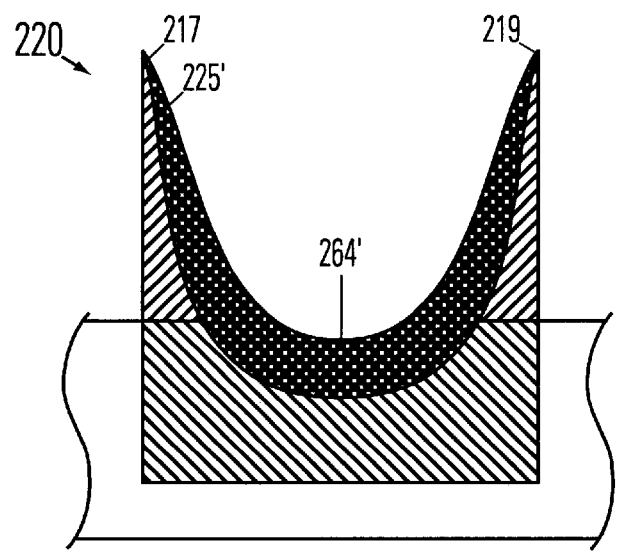
FIG. 2B illustrates another embodiment of a floating gate where the floating gate includes lateral ends having a sloped thickness.

FIG. 2B illustrates a second embodiment of a floating gate 220 according to the present invention in which the floating gate is provided tipped or peaked lateral ends. As illustrated, the first, second, and third polysilicon layers combine so that the thickness of the floating gate 220 increases continuously from a minimum thickness 264' to the first and second lateral end 217 and 219. The resulting coupling surface 225' is defined by a thickness profile of the floating gate 220 where a slope of the thickness profile between the minimum thickness region 264 and each of the lateral ends 222, 224 ranges between 0 and 90 degrees. The thickness profile in turn provides for the coupling surface to be contoured so as to extend the coupling length of the floating gate between the first and second lateral ends.

Figure 2C:
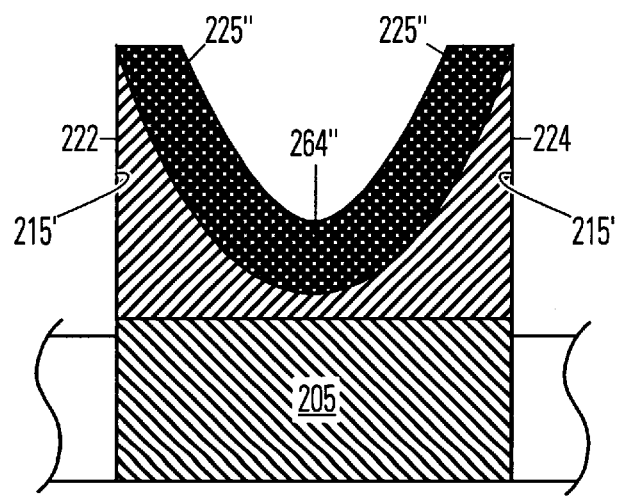
FIG. 2C illustrates another embodiment of a floating gate according to the present invention where the floating gate includes a thickness extending across the floating gate that comprises at least three polysilicon layers.

FIG. 2C shows another embodiment where the floating gate has a contoured coupling surface. In this embodiment, a first polysilicon layer is deposited in a first fabrication step to form a base structure 205 extending from the first lateral end 222 to the second lateral end 224. A second polysilicon layer is deposited to extend continuously between the first and second lateral ends 222 and 224 over the first polysilicon layer. The second polysilicon layer is deposited to form a region of maximum thickness adjacent each of the lateral ends and a region of minimum thickness 264" over a middle region of the floating gate. The resulting topography of the second polysilicon layer forms tapered sidewalls 215, 215' adjacent to the respective lateral ends 222 and 224, with some thickness of the second polysilicon layer extending continuously over the base 205. A third polysilicon layer is deposited over the second polysilicon layers to form a contoured coupling surface 225" extending between the first and second lateral end 222 and 224. In the embodiment of FIG. 2C, the first layer of polysilicon has a substantially uniform thickness between the first and second lateral ends 222 and 224.

Figure 3A:
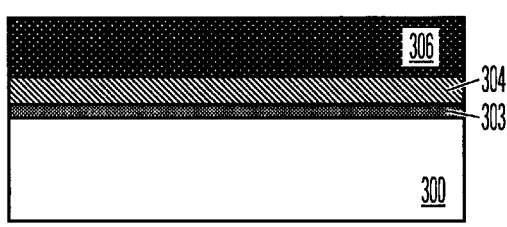
FIG. 3A illustrates a semiconductor structure having a tunnel oxide layer, a polysilicon layer and a masking layer grown over a substrate.

FIGS. 3A–3I illustrate a first embodiment for fabricating a memory cell according to the present invention and more specifically, an array of floating gates. As illustrated in FIG. 3A, a relatively thin tunnel oxide layer 303 is grown over a substrate 300 to preferably approximately 100 Angstroms thickness. In an embodiment such as the one shown by FIG. 4, the substrate includes a p-type substrate. Next, a conductive layer for forming a floating gate such as a first polysilicon layer 304 is deposited over the tunnel oxide layer 303. An insulative or masking layer 306 comprised of a material such as silicon nitride ($Si_3N_4$) is sequentially deposited over the first polysilicon layer 304. The masking layer 306 may be formed on the tunnel oxide layer 303 by low pressure chemical vapor deposition (LPCVD) or plasma enhance chemical vapor deposition (PECVD).

Figure 3D:
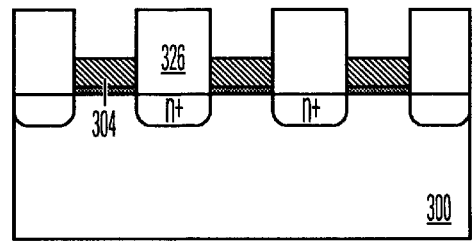
FIG. 3D illustrates the masking layer being removed to create a step topography between the polysilicon layer and the oxide structure.
Figure 3B:
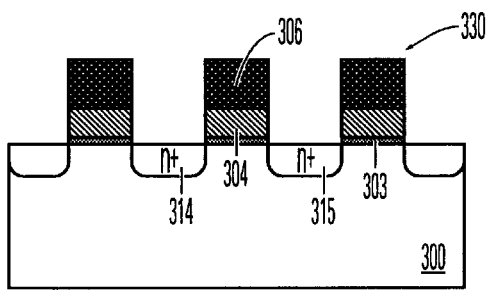
FIG. 3B illustrates the polysilicon layer and masking layer being etched away to form a pattern of columns.

As illustrated in FIG. 3B, the first polysilicon layer 304 and masking layer 306 are etched away to form a pattern of polysilicon-nitride columns 330 spaced apart over the substrate 300. Preferably, the columns 330 are defined by a photo masking process. In this step, dopants are used to create diffusion regions 314 and 315 between the columns 330. This may be accomplished using conventional ion implantation methods, although chemical or other similar processes may also be employed. A dopant employed to create the diffusion regions such as Arsenic (As), is implanted into the substrate 300.

Figure 3E:
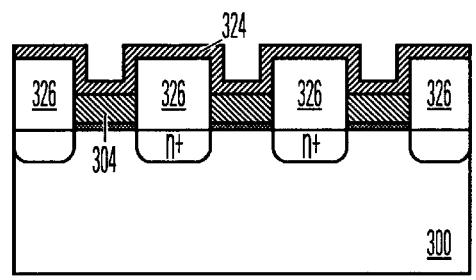
FIG. 3E illustrates a second polysilicon layer deposited over the step topography comprising the columns and the oxide structures.
Figure 3C:
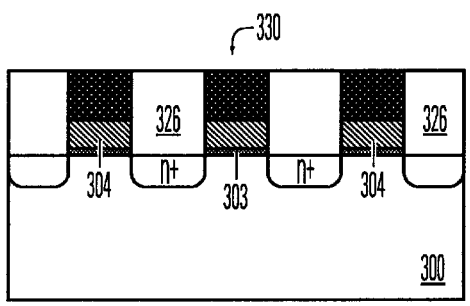
FIG. 3C illustrates oxide structures being deposited between the columns so that each column is abutted by an oxide structure.

FIG. 3C illustrates an oxide structure 326 being deposited in between the individual polysilicon-nitride columns 330. Next, the polysilicon-nitride columns 330 and oxide layers 326 are planerized, preferably by chemical mechanical polishing means (CMP). Planerization causes the oxide structure 326 to be flush with the masking layer 306 of the columns 330 against a horizontal plane. Alternative methods for planerizing the oxide structure 326 and masking layer 306 include etching back the oxide structure to be flush with the masking layer 306. The oxide structures 326 serve to insulate the polysilicon layers 304 from electron leakage, while also providing an alignment structure that will determine the height of a subsequent polysilicon deposition (shown in step 3D). As such, the height of the oxide structure 326 may be used to determine the height of the floating gate as a whole. The oxide structure 326 may be deposited onto the substrate 300 by numerous methods, including LPCFD, PECVD, and high-density plasma CVD (HDPCVD).

As illustrated in FIG. 3D, the masking layer 306 is removed from the columns 330 by a wet etching process to expose the first polysilicon layer 304 in between oxide structure 326. The resulting structure has a step-topography that forms an alignment structure for subsequent deposition of additional polysilicon layers.

Next, FIG. 3E shows a second layer of polysilicon 324 being deposited over the first polysilicon layer 304 and oxide structure 326. The second polysilicon layer 324 continuously extends over the oxide structure 326 and the first polysilicon layer 304. By using the oxide structure 326 for alignment, the thickness of the first and second polysilicon layers 304 and 324 are thickest at the lateral ends of the floating gate. The second polysilicon layer 324 may be used to form the contours of the floating gate for a third polysilicon layer subsequently deposited. While FIG. 3E shows the second polysilicon layer 324 is deposited such that it forms sharp 90 degree angles, the second polysilicon layer 324 may also be deposited to form more rounded corners. Rounded corners are formed by depositing the second polysilicon layer 324 in a manner where its thickness blends more gradually as it conforms to the topography of the first polysilicon layer 304 and oxide structures 326.

Figure 3F:
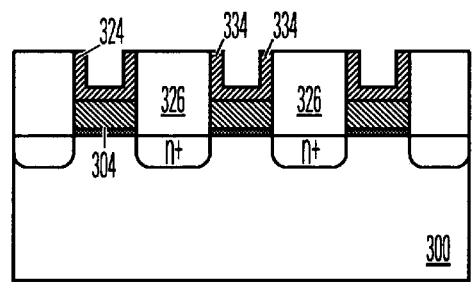
FIG. 3F illustrates the second polysilicon layer etched back to selectively remove all of the second polysilicon layer on top of the oxide structures.

As illustrated in FIG. 3F, the second polysilicon layer 324 is removed from the top of the oxide layer 326, preferably through a CMP process. Alternatively, the second polysilicon layer 324 may be removed by dry etching, provided a film is used to separate the first polysilicon layer 304 from the second polysilicon layer 324. The second polysilicon layer 324 has raised ends 334 extending a thickness adjacent to the oxide structures 326. Preferably, the space defined by the oxide structures 326 is a rectangular recess.

Figure 3G:
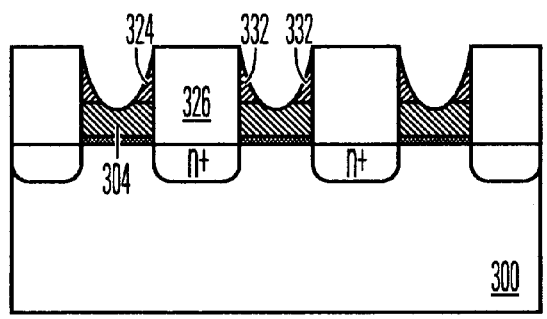
FIG. 3G illustrates a further etch back of the second polysilicon layer.

FIG. 3G shows that the remaining portion of the second layer of polysilicon 324, as well as a portion of the first layer of polysilicon 304, are removed to create a sloped cavity between the oxide structures 326. Preferably, the first and second layers of polysilicon 304 and 326 are simultaneously removed by spacer etching. An intermediate floating gate structure is formed between the oxide structures 326 having a base formed by the first layer of polysilicon 304 with opposing tapered sidewalls 332 adjacent being spaced apart and adjacent to each oxide structure 326.

Figure 3H:
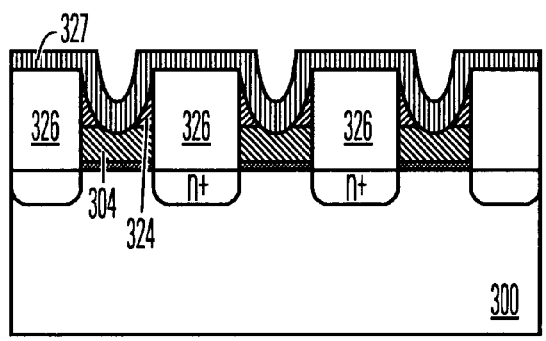
FIG. 3H illustrates deposition of a third polysilicon layer.

FIG. 3H shows a third polysilicon layer 327 is deposited over the oxide layer 326. The third polysilicon layer 327 is deposited over the second and first polysilicon layers 324 and 304. In a preferred fabrication method, the third polysilicon layer 327 is also deposited over the oxide structures 326. Between pairs of oxide structures 326, the third polysilicon layer 327 is sloped to the shape formed by the first and second polysilicon layers 304 and 324. In this manner, sharp corners and angles may be avoided by deposition of the third polysilicon layer 327.

Figure 3I:
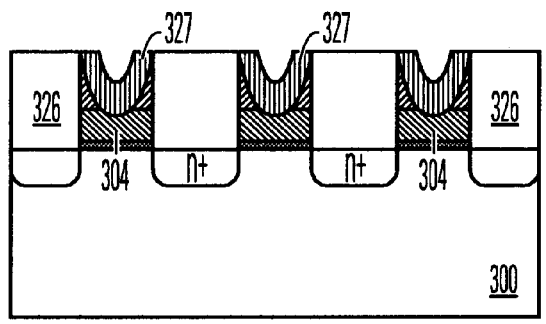
FIG. 3I illustrates an etch back of the third polysilicon layer.

As illustrated by FIG. 3I, another CMP process is conducted over the top surface of the oxide structure 326 to remove the third polysilicon layer 327 therefrom. Alternatively, the third polysilicon layer 327 may be removed by dry etching, provided a film is used to separate the second layer of polysilicon 324 from the third layer of polysilicon 327.

Figure 3J:
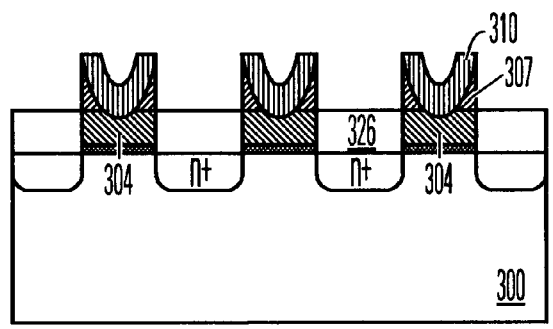
FIG. 3J illustrates an oxide structure is removed to shorten the top surface of the oxide structure and to form a contoured top or coupling surface on upper portions of the combined polysilicon layers.

FIG. 3J shows that the oxide structure 326 is partially removed so that the polysilicon structure extends vertically beyond the oxide structure 326. A portion of the oxide structure may be removed through a dipping process. In the resulting floating gate, a thickness at lateral ends adjacent the oxide structures 326 is greater than the remainder of the floating gate. The thickness of the floating gate decreases continuously to a middle region of the floating gate.

Figure 3K:
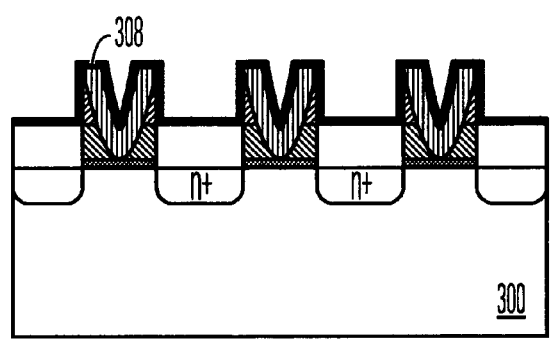
FIG. 3K illustrates a dielectric layer deposited over the polysilicon layer and the oxide structure.

As illustrated in FIG. 3K, an interpolysilicon dielectric 308 is deposited to cover the third polysilicon 327 and adjacent oxide structure 326. The preferred interpolysilicon dielectric material is ONO, although other materials such as $SiO_2$ are suitable. In an embodiment, the ONO layer comprises a high temperature oxide deposited by CVD, a CVD nitride and another high temperature oxide deposited by CVD. In one exemplary embodiment, the thickness of the first oxide layer is 62 Angstroms, the thickness of the nitride layer is 62 Angstroms, and the thickness of the bottom oxide layer is 45 Angstroms. The deposition of the second dielectric layer is followed by deposition of a second polysilicon layer 472, and $WSI_X$ 474, which combine to form the control gate.

Figure 3L:
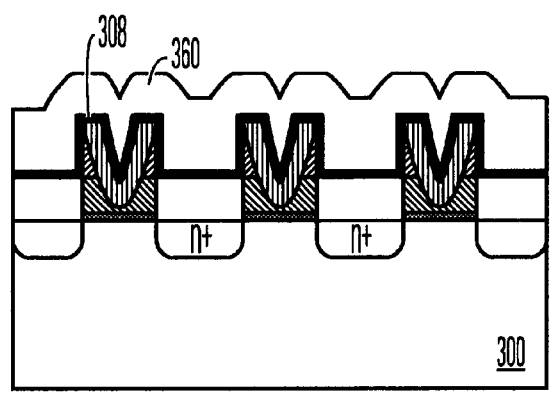
FIG. 3L illustrates completion of the memory cell with deposition of another polysilicon layer over the dielectric layer.

FIG. 3L shows that a fourth layer of polysilicon 360 is deposited as word-line gate control. The floating gate formed by a method under this invention may then be combined with the control gate to form a memory all using principals known in the art.

Figure 4:
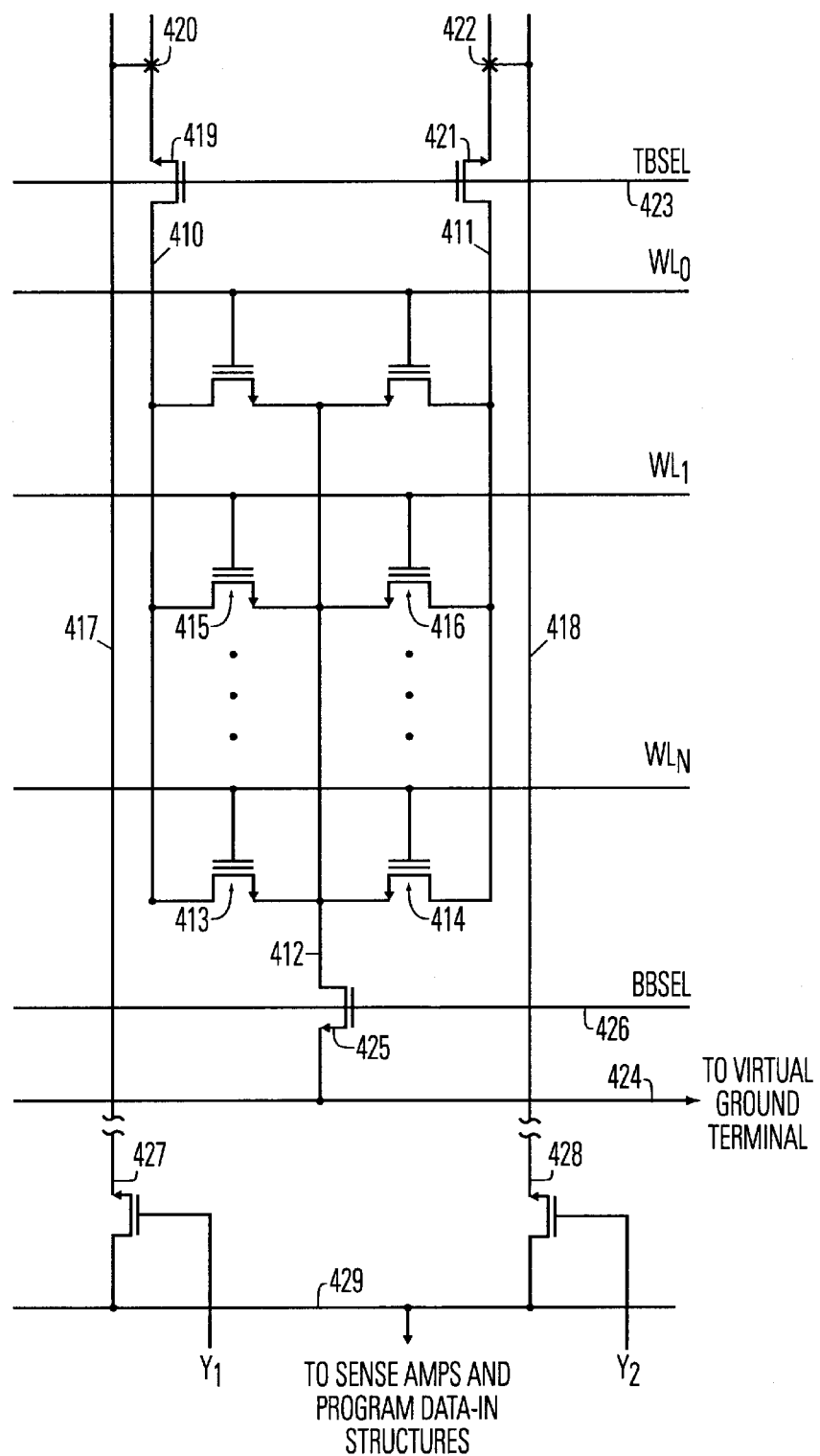
FIG. 4 illlustrates the drain-source configuration of the FLASH EPROM circuit according to another embodiment of the present invention.

FIG. 4 illustrates the drain-source-drain configuration of the FLASH EPROM circuit according to the present invention. The circuit includes a first local bitline 410 and a second local bitline 411. The first and second local bitlines 410, 411 are implemented by buried diffusion conductors as described below. Also included is a local virtual ground line 412 implemented by buried diffusion. A plurality of floating gates, drains and sources are coupled to the local bitlines 410, 411 and local virtual ground line 412. The sources of the plurality transistors are coupled to the local virtual ground line 412. The drains of a first column of transistors, generally 413, are coupled to the first local bitline 410, and the drains of a second column of transistors, generally 414, are coupled to the s econd local bitline 411. The gates of the floating gate transistor are coupled to word-lines $WL_0$ through $WL_N$, where each word-line (e.g., $WL_1$,) is coupled to the gate of a transistor (e.g., transistor 416) in the second column 414. Thus, transistors 415 and 416 can be considered a two transistor cell with a shared source diffusion.

A first global bitline 417 and a second global bitline 418 are associated with each drain-source-drain block as shown in FIG. 4. The first global bitline 417 is coupled to the source of top block select transistor 419 through a metal-to-diffusion contact 420. Similarly, the second bitline 418 is coupled to the source of top block select transistor 421 through a metal-to-diffusion contact 422. The drains of the top block select transistors 419, 421 are coupled to the first and second local bitlines 410 and 411 respectively. The gates of the top block selector transistors 419, 421 are controlled by a top block select signal TBSEL on line 423.

The local virtual ground line 412 is coupled to a virtual ground terminal across conductor 424 through bottom block selector transistor 425. The drain of the bottom block select transistor 425 is coupled to the local virtual ground line 412. The source of the bottom block select transistor 425 is coupled to the conductor 424. The gate of the bottom block select transistor 425 is controlled by a bottom block select signal BBSEL across line 426. In the preferred system, the conductor 424 is a buried diffusion conductor which extends to a metal-to-diffusion contact at a position displaced horizontally through the array, which provides contact to a vertical metal virtual ground bus.

The global bitlines extend vertically through the array to respective column select transistors 427, 428, through which a selected global bitline is coupled to sense amps and program data circuitry (not shown). Thus, the source of column select transistor 427 is coupled to global bitline 417, the gate of column select transistor 427 is coupled to a column decode signal $Y_1$, and the drain of the column select transistor 427 is coupled to conductor 429.

Alternative memory array device architectures may also be used with this invention. For example, U.S. Pat. No. 5,696,019 to Chang, incorporated herein by reference, discloses a memory device architecture suitable with this invention comprising a plurality of columns of memory cells sharing one or more bit lines. The architecture is based on a source-drain cell configuration in which each column of cells has a single buried diffusion local source line. An isolation structure such as a trench oxide is positioned between each column of cells.

Memory cell operation may be accomplished through one of several ways. In this embodiment, the memory cells are programmed by providing a first positive voltage value to the control gate and a second positive voltage valve to the buried drain diffusion, while the buried n-type source diffusion is at 0 volts. Under these conditions, electrons may tunnel from the valence band to the conduction band, leaving free holes in the valance bands. The voltage at the control gate attracts electrons towards the floating gate. The electrons are accelerated in the strong vertical electrical field between the drain diffusion and the control gate and a number of them become "hot" electrons with sufficient energy to be injected through a tunneling dielectric layer 106 (as shown by FIG. 1) into the floating gate 120 (FIG. 1).

Erasure is accomplished by F-N tunneling from the floating gate to the buried n-type source diffusion region. During erasure, a negative voltage is applied to the control gate, a positive voltage is applied to the source diffusion, and the drain is floating. As a result, F-N tunneling erasure of electrons from the floating gate to a source side will take place.

In other variations, a F-N tunneling programming (electron tunneling from floating gate to drain side through F-N tunneling) and channel erasing (electron from channel to floating gate through F-N tunneling) may be used. Still further, the memory cell may employ F-N tunneling programming (electron from channel to floating gate through F-N tunneling) and F-N channel erasing (electron from floating gate to channel by F-N tunneling).

Reading may be accomplished by providing a positive voltage to the drain diffusion and a positive voltage to the control gate, with the source at 0 volts. When the floating gate is charged, the threshold voltage for causing the n-channel transistor to conduct is decreased below the voltage applied to the control gate during a read operation. Thus a charged transistor will not conduct during a read operation and an uncharged transistor will conduct. The non-conducting state of the cell can be interpreted as a binary 1 or 0 depending on the polarity of the sensing circuitry.

The voltages required for programming, erasing, and/or reading operations depends in part on a coupling ratio between the floating gate and the control gate of the memory cell. The voltage across the floating gate may be characterized by the following equation:

$$V_{FG} = V_{CG}[C_{CR}/(C_{CR}+C_K)]$$

In the above equation, $C_{CR}$ is the capacitive couple ratio between the floating gate and the control gate. The factor $C_K$ represents the capacitive coupling of the floating gate across the tunnel oxide layer 206 for programming, erasing, or reading. As the above equation shows, the higher the coupling ratio between the floating gate and the control gate, the more equal the voltage across the floating gate is compared to the voltage across the control gate. As such, increasing the coupling ratio between the floating gate and the control gate decreases the voltage required to effectuate programming, erasing, or reading.

Some memory devices of the known art provide the floating gate with a greater coupling surface in order to increase the coupling ratio between the floating gate and the control gate. This has previously been accomplished by enlarging the lateral dimensions of the floating gate on the substrate. As such, the floating gates of the known art occupy a significant percentage of the real estate allocated on the memory array device. By contrast, this invention provides a comparable floating gate but having reduced lateral dimensions. More specifically, this invention provides for a floating gate having reduced later dimensions but which maintains or increases the coupling ratio between the floating gate and the control gate.

The foregoing description of preferred embodiments of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for forming a contoured floating gate for use in a floating gate memory cell, the method comprising:

forming a recessed polysilicon layer between a first alignment structure and a second alignment structure;

forming a second polysilicon layer disposed on the recessed polysilicon layer, the recessed polysilicon layer and the second polysilicon layer combining to form a polysilicon structure having a maximum thickness at a first lateral end region adjacent to the first alignment structure and at a second lateral end region adjacent to the second alignment structure, and the polysilicon structure having a minimum thickness at a middle region positioned between the first lateral end region and the second lateral end region, thereby defining a contour of the polysilicon structure between the first lateral end region and the second lateral end region; and forming a polysilicon layer on the polysilicon structure such that the polysilicon layer adopts the contour.

2. The method of claim 1, wherein forming the polysilicon structure includes removing a portion of the second polysilicon layer from the middle region.

3. The method of claim 2, wherein removing the portion of the second polysilicon layer in the middle region further includes removing a portion of the first polysilicon layer from the middle region.

4. The method of claim 2, wherein forming a polysilicon structure includes removing a portion of the second polysilicon layer from the middle region so that a remaining portion of the second polysilicon layer forms a slope of between 0–90 degrees between a maximum thickness at the first lateral end region and the middle region, and between the second lateral end region and the middle region.

5. The method of claim 1, wherein forming a first polysilicon structure includes:

forming a first polysilicon layer between the first alignment structure and the second alignment structure;

forming the second polysilicon layer over a topography defined by the first alignment structure, the second alignment structure, and the first polysilicon layer; and removing the second polysilicon layer from the first alignment structure and the second alignment structure, thereby leaving the second polysilicon layer disposed on the first polysilicon layer between the first alignment structure and the second alignment structure, the first polysilicon layer and the second polysilicon layer combining to form a polysilicon floating gate structure.

6. A method for forming a contoured floating gate for use in a floating gate memory cell, the method comprising:

forming a first polysilicon layer between a first alignment structure and a second alignment structure;

forming a second polysilicon layer disposed on the first polysilicon layer to form a floating gate structure of the first polysilicon layer and the second polysilicon layer, the floating gate structure having a first lateral end region and a second lateral end region, the first lateral end region being adjacent to the first alignment structure and the second lateral end region being adjacent to the second alignment structure;

removing a portion of the floating gate structure at a middle region between the first lateral end region and the second lateral end region to reduce a thickness of the middle region to form a contour between the first lateral end region and the second lateral end region; and forming a third polysilicon layer on the second polysilicon layer such that the third polysilicon layer adopts the contour.

7. The method of claim 6, wherein forming a second polysilicon layer includes depositing the second polysilicon layer in such a manner that the second polysilicon layer has a maximum thickness at the first lateral end region and at the second lateral end region and a minimum thickness between the first lateral end region and the second lateral end region.

8. The method of claim 6, wherein removing a portion of the floating gate structure to reduce a thickness of the middle region includes removing a portion of the second polysilicon layer and removing a portion of the first polysilicon layer.

9. The method of claim 6, wherein removing a portion of the floating gate structure to reduce a thickness at a middle region includes forming a contoured recess by removing a portion of the second polysilicon layer and a portion of the first polysilicon layer.

10. A method for forming a floating gate memory cell, the method comprising:

providing a substrate;

forming source and drain regions over the substrate;

depositing an insulating layer over the source and drain regions forming a contoured floating gate positioned over the insulating layer between the source and drain regions, the floating gate being formed by forming a polysilicon structure between a first alignment structure and a second alignment structure, the polysilicon structure having a maximum thickness at a first lateral end region to the first alignment structure and at a second lateral end region adjacent to the second alignment structure, and the polysilicon structure having a minimum thickness at a middle region positioned between the first lateral end region and the second lateral end region thereby forming a contour between the first lateral end region and the second lateral end region; and forming a polysilicon layer over the polysilicon structure such that the polysilicon layer adopts the contour.

11. The method of claim 10, wherein forming a first polysilicon structure includes:

forming a first polysilicon layer between the first alignment structure and the second alignment structure;

forming a second polysilicon layer over a topography defined by the first alignment structure, the second alignment structure, and the first polysilicon layer; and removing the second polysilicon layer from the first alignment structure and the second alignment structure.

12. The method of claim 10, wherein forming a polysilicon structure between a first alignment structure and a second alignment structure comprises:

depositing a first polysilicon layer over the substrate; and depositing a second polysilicon layer on the first polysilicon layer so that the second polysilicon layer has a maximum thickness at the first lateral end region and at the second lateral end region.

13. The method of claim 12, wherein forming a polysilicon structure includes removing a portion of the second polysilicon layer from the middle region.

14. The method of claim 13, wherein removing a portion of the second polysilicon layer in the middle region further includes removing a portion of the first polysilicon layer from the middle region.

15. The method of claim 13, wherein forming a polysilicon structure includes removing a portion of the second polysilicon layer from the middle region so that a remaining portion of the second polysilicon layer forms a slope of between 0–90 degrees between a maximum thickness at the first lateral end region and the middle region and between the second lateral end region and the middle region.

16. The method of claim 13, wherein forming a first polysilicon structure includes removing a portion of the second polysilicon layer from the middle region of the polysilicon structure so as to form a contoured recess that defines the region positioned towards the middle of the floating gate having the minimum thickness.

17. A method for forming a floating gate memory cell, the method comprising:

providing a substrate;

forming source and drain regions over the substrate;

depositing an insulating layer over the source and drain regions;

forming a contoured floating gate positioned over the insulating layer between the source and drain regions, the floating gate being formed by forming a first polysilicon layer between a first alignment structure and a second alignment structure;

forming a second polysilicon layer on the first polysilicon layer to form a floating gate structure of the first polysilicon layer and the second polysilicon layer, the floating gate structure having a first lateral end region and a second lateral end region, the first lateral end region being adjacent to the first alignment structure and the second lateral end region being adjacent to the second alignment structure;

removing a portion of the floating gate structure at a middle region between the first lateral end region and the second lateral end region to reduce a thickness of the middle region and thereby form a contour between the first lateral end region and the second lateral end region; and forming a third polysilicon layer on the second polysilicon layer such that the third polysilicon layer adopts the contour of the second layer.

18. The method of claim 17, wherein forming a second polysilicon layer includes depositing the second polysilicon layer in such a manner that the second polysilicon layer has a maximum thickness at the first lateral end region and at the second lateral end region and a minimum thickness between the first lateral end region and the second lateral end region.

19. The method of claim 17, wherein removing a portion of the floating gate structure to reduce a thickness of the middle region includes removing a portion of the second polysilicon layer and a portion of the first polysilicon layer.

20. The method of claim 17, wherein removing a portion of the floating gate structure to reduce a thickness at a middle region includes forming a contoured recess by removing a portion of the second polysilicon layer and a portion of the first polysilicon layer.

21. A method for forming a floating gate memory cell, the method comprising:

forming a floating gate structure on a gate oxide layer disposed on a substrate, the floating gate structure being between a first oxide spacer overlying a first drain-source region and a second oxide spacer overlying a second drain-source region, the floating gate structure having a first lateral end extending above the first oxide spacer, a second lateral end extending above the second oxide spacer, and a middle region, the first lateral end having an end thickness and the middle region having a middle thickness, the middle thickness being less than the end thickness by a thickness difference;

forming an inter-conductor dielectric layer on the floating gate structure, the inter-conductor dielectric layer having a dielectric layer thickness less than the thickness difference between the end thickness and the middle thickness; and forming a conductor layer on the inter-conductor dielectric layer.

22. The method of claim 21, wherein the inter-conductor layer is formed on a first outer sidewall of the first lateral end, an inner contour region of the floating gate structure between the first lateral end and the second lateral end, and a second outer sidewall of the second lateral end.

23. The method of claim 22 wherein, the inter-conductor layer is further formed on a first plateau region of the floating gate structure, the first plateau region being disposed between the first lateral end region and the inner contour region and having a surface essentially parallel to the surface of the substrate.

* * * * *